US008994446B2

(12) United States Patent
Pietri et al.

(10) Patent No.: US 8,994,446 B2
(45) Date of Patent: Mar. 31, 2015

(54) INTEGRATED CIRCUITS AND METHODS FOR MONITORING FORWARD AND REVERSE BACK BIASING

(71) Applicants: Stefano Pietri, Austin, TX (US); Chris C. Dao, Pflugerville, TX (US); Anis M. Jarrar, Austin, TX (US); Juxiang Ren, Austin, TX (US)

(72) Inventors: Stefano Pietri, Austin, TX (US); Chris C. Dao, Pflugerville, TX (US); Anis M. Jarrar, Austin, TX (US); Juxiang Ren, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 22 days.

(21) Appl. No.: 13/930,657

(22) Filed: Jun. 28, 2013

(65) Prior Publication Data

US 2015/0002215 A1 Jan. 1, 2015

(51) Int. Cl.
*H03K 3/01* (2006.01)
*G05F 1/10* (2006.01)

(52) U.S. Cl.
CPC .................................... *G05F 1/10* (2013.01)
USPC .................................................... 327/534

(58) Field of Classification Search
CPC .................................................. G05F 3/205
USPC ............................. 327/534, 535, 537, 539
See application file for complete search history.

(56) References Cited

U.S. PATENT DOCUMENTS

| | | | | |
|---|---|---|---|---|
| 6,653,890 | B2 | 11/2003 | Ono et al. | |
| 6,731,158 | B1 | 5/2004 | Hass | |
| 6,731,159 | B2 | 5/2004 | Van Zanten et al. | |
| 7,498,863 | B2 * | 3/2009 | Denais et al. | 327/427 |
| 8,154,335 | B2 | 4/2012 | Chawla et al. | |
| 8,269,545 | B2 | 9/2012 | Chawla et al. | |
| 8,350,616 | B1 * | 1/2013 | Fu et al. | 327/536 |

OTHER PUBLICATIONS

U.S. Appl. No. 13/764,946, Jarrar, A.M., et al., "Fine Grain Voltage Scaling of Back Biasing", filed Feb. 12, 2013.

* cited by examiner

*Primary Examiner* — Jeffrey Zweizig
(74) *Attorney, Agent, or Firm* — Mary Jo Bertani; Joanna G. Chiu

(57) ABSTRACT

An integrated circuit includes a device of a first conductivity type formed in a first well; a voltage regulator configured to provide a bias voltage to the first well based on a first reference voltage which is generated using a first band gap reference generator; and a monitor circuit configured to compare a voltage of the first well to an upper limit and a lower limit of a first voltage range, wherein each of the upper limit and lower limit is provided using a second band gap reference generator, separate from the first band gap reference generator, wherein, in response to determining that the voltage of the first well is outside of the first voltage range, providing a first out of range indicator.

20 Claims, 2 Drawing Sheets

INTEGRATED CIRCUITS AND METHODS FOR MONITORING FORWARD AND REVERSE BACK BIASING

BACKGROUND

1. Field

This disclosure relates generally to semiconductor structures, and more specifically, to semiconductor devices that monitor forward and reverse back bias voltages for adjusting threshold voltage of transistors.

2. Related Art

Integrated circuits are comprised of semiconductor devices such as complementary metal oxide semiconductor field effect transistors (CMOSFETs) formed on a substrate with either a positively charged or negatively charged doped body or well region. MOSFETs also include a source terminal and a drain terminal that are connected to highly doped regions separated by the well region. The source and drain regions can be either p or n type, but they are both the same type, and of opposite type to the doping of the well region. If the MOSFET is an n-channel or n-type FET, then the source and drain are 'n+' regions and the well region is a 'p' region. If the MOSFET is a p-channel or p-type FET, then the source and drain are 'p+' regions and the well region is an 'n' region.

For n-type devices, sufficient voltage applied at a gate between the source and drain regions increases the current flow in a channel between the source and the drain regions. For gate voltages below a threshold value, the channel is lightly populated, and only a very small subthreshold leakage current flows between the source and the drain. As the voltage increases to a threshold level, current flow increases from the drain to the source region. P-type devices work in a manner opposite to n-type devices. A negative gate-source voltage creates a p-channel at the surface of the n-well region, analogous to the n-channel case, but with opposite polarities of charges and voltages. When a voltage less negative than the threshold value (a negative voltage for p-channel) is applied between gate and source, the channel disappears and only a very small subthreshold current can flow between the source and the drain.

In order to adjust threshold voltage required to operate MOSFETs, a bias voltage can be applied to the well regions, causing the well region to act as a second gate. The well region can be referred to as the "back gate" and bias voltage applied to the back gate can be referred to as "back bias" voltage. The back bias voltage can increase or decrease the threshold voltage. For an n-type device, a forward (positive comparing to its source voltage) back bias voltage applied to the p-well lowers the threshold voltage while a reverse (negative comparing to its source voltage) back bias voltage raises the threshold voltage. For a p-type device, a forward (negative comparing to its source voltage) back bias voltage applied to the n-well lowers the threshold voltage while a reverse (positive comparing to its source voltage) back bias voltage increases the threshold voltage.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and structures for integrated circuits are disclosed that are capable of generating back bias for semiconductor devices. The back bias voltages are monitored during operation and an indication of when the back bias voltages are outside of an acceptable range are provided to a safe state monitor, which can reset the device when a back bias voltage is out of range. Monitoring to determine when back bias voltages are out of range allows use of back bias techniques to improve performance and reduce power consumption by integrated circuits. This is better understood by reference to the following description and the drawings.

Figure 1:
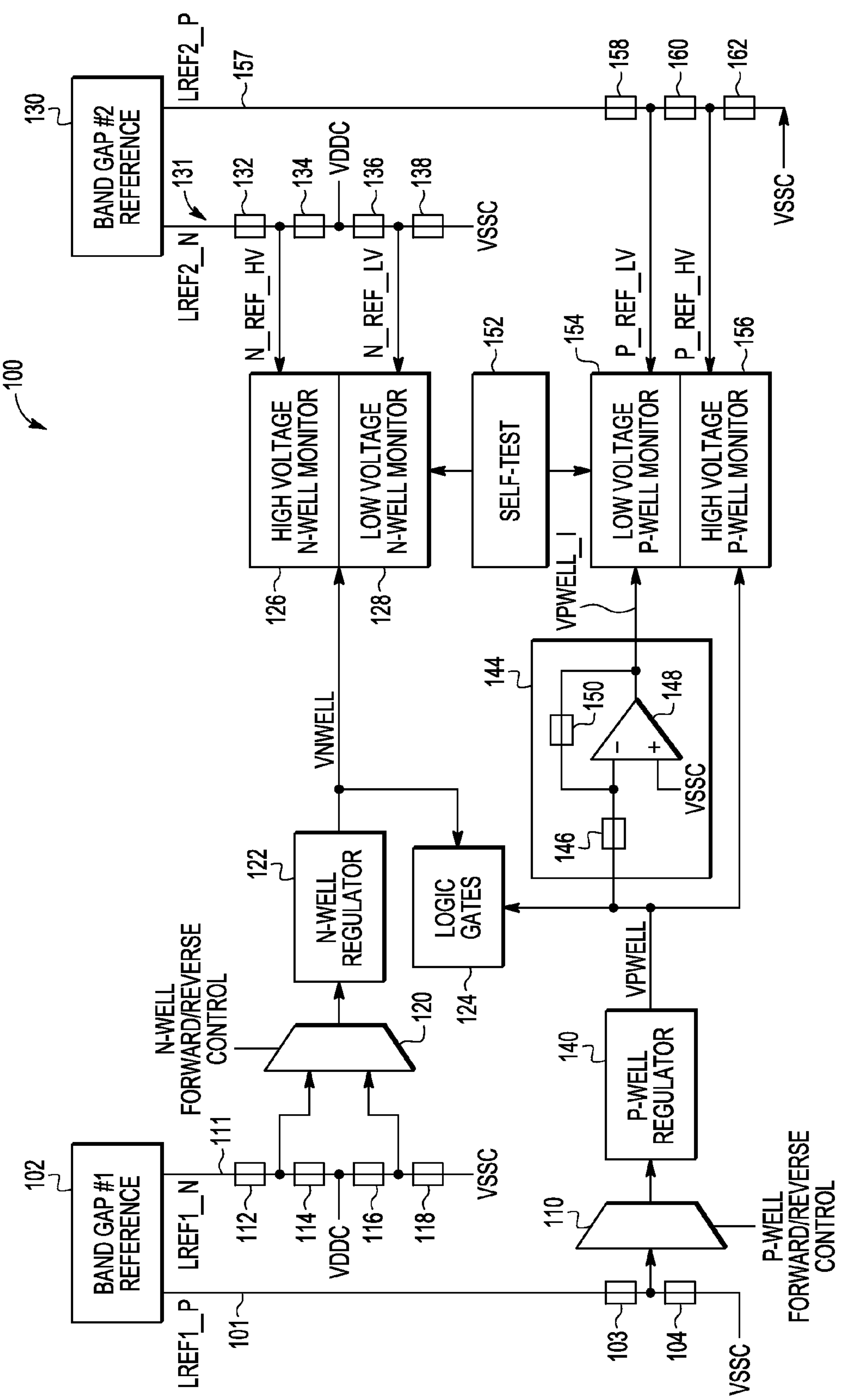
FIG. 1 is a block diagram of an embodiment of an integrated circuit according to a first embodiment.

FIG. 1 is a block diagram of an embodiment of an integrated circuit 100 according to a first embodiment that includes first band gap reference circuit 102 coupled to one end of a first resistor ladder 101 with resistors 103 and 104, and further coupled to one end of a second resistor ladder 111 that includes resistors 112, 114, 116, 118. A second end of the first and second resistor ladders is coupled to a ground VSSC or core supply voltage VDDC. The number of resistors shown in the first and second resistor ladders is only an example. Any suitable number and value of resistors can be used in the first and second resistor ladders.

A reference voltage between first band gap reference circuit 102 and resistor 112 is denoted as LREF1_N. The magnitude of LREF1_N decreases through resistor 112, and then again through resistor 114. The voltage between resistors 114 and 116 is core supply voltage VDDC. The magnitude of VDDC decreases through resistor 116, and then again through resistor 118. A first n-well reference voltage tapped between first band gap reference circuit 102 and resistor 112 or between resistors 112 and 114 on the second resistor ladder 111 is coupled as a first input to multiplexer 120. A second n-well reference voltage tapped between resistor 116 and resistor 118, or between resistor 118 and VSSC on the second resistor ladder 111, is coupled as a second input to multiplexer 120.

To forward back bias a p-type device with its source connected to VDDC, a voltage below VDDC is applied to the n-well. To reverse back bias a p-type device with its source connected to VDDC, a voltage above VDDC is applied to the n-well. An n-well forward/reverse back bias control input to multiplexer 120 determines whether a forward or reverse back bias voltage is provided to n-well regulator 122. An n-well voltage (VNWELL) is output by n-well regulator 122 and provided to n-well high voltage monitor 126, n-well low voltage monitor 128, and n-well of logic gates 124.

Logic gates 124 comprise the logic circuitry including AND gates, OR gates, inverters, among others, of integrated circuit 100, for which their back-gate terminal may not be connected to their source terminal.

N-well high voltage monitor 126 receives input VNWELL from n-well regulator 122 and a reference voltage from resistor ladder 131 having one end coupled to a second band gap reference circuit 130 and a second end coupled to VSSC. Resistor ladder 131 includes resistors 132, 134, 136, 138. The number of resistors shown in resistor ladder 131 is only an example as any suitable number and value of resistors can be used in the resistor ladder 131.

Voltage between second band gap reference circuit 130 and resistor 132 is denoted as LREF2_N. The magnitude of LREF2_N decreases through resistor 132, and then again through resistor 134. The voltage between resistors 134 and 136 is core supply voltage VDDC. The magnitude of VDDC decreases through resistor 136, and then again through resistor 138. An n-well high voltage reference (N_REF_HV) tapped between voltage LREF2_N from second band gap reference circuit 130 and resistor 132 or between resistors 132 and 134 on the second resistor ladder 131 is coupled as input to n-well high voltage monitor 126. An n-well low voltage reference (N_REF_LV) tapped between resistor 136 and resistor 138, or between resistor 138 and VSSC, on the second resistor ladder 131 is coupled as an input to n-well low voltage monitor 128. Note that voltages N_REF_HV and N_REF_LV can be tapped at other suitable locations between different resistors on resistor ladder 131.

With regard to devices with p-wells, a voltage (LREF1_P) from band gap reference circuit 102 is coupled to resistor ladder 101. As shown, a p-well reference voltage taken between resistors 103 and 104 is provided to multiplexer 110, however, the p-well reference voltage can be taken from resistor ladder 101 between band gap reference circuit 102 and resistor 103, or coupled to VSSC, depending on the amount of reverse back bias voltage to be used. A p-well forward/reverse back bias control input to multiplexer 110 determines whether the p-well reference voltage is provided to p-well regulator 140.

A forward back bias voltage can be generated in p-well regulator 140 and another multiplexer (not shown) can be included in p-well regulator 140 to select between the forward and reverse back bias voltages. In some implementations, p-well regulator 140 includes distributed charge pumps to regulate bias voltage between (VSSC−350 mV) and VSSC. A linear regulator can also be included to regulate the bias voltage between VSSC and (VSSC+350 mV). An alternative implementation with higher precision but greater power consumption uses a charge pump to generate a negative voltage and a linear regulator to generate a bias voltage between (VSSC−300 mV) and (VSSC+300 mV).

A p-well voltage (VPWELL) is output by p-well regulator 140 and provided to p-well high voltage monitor 156, p-well low voltage monitor 154 via inverting gain-stage circuit 144, and logic gates 124. Inverting gain-stage circuit 144 includes an amplifier 148, a resistor 146 coupled between the output of p-well regulator 140 and a negative input to amplifier 148, and a second resistor 150 coupled between the negative input of amplifier 148 and the output of amplifier 148. A first resistor 146 coupled between input terminal of the inverting gain-stage and the negative input of amplifier 148. A positive input to amplifier 148 is coupled to VSSC. In the p-well bias case, the low voltage monitor threshold is negative (below VSSC). In order to compare low voltage monitor threshold to a positive reference, the input p-well voltage (VPWELL) is inverted from negative to positive using an inverting gain-stage first, then compared with a positive reference, for example, VSSC+ 400 mV for forward back bias case.

P-well high voltage monitor 156 receives input voltage VPWELL from p-well regulator 140 and a reference voltage (P_REF_HV) from resistor ladder 157 having one end coupled to a second band gap reference circuit 130 and a second end coupled to VSSC. Resistor ladder 157 includes resistors 158, 160, 162. The number of resistors shown in resistor ladder 157 is only an example as any suitable number and values of resistors can be used in the resistor ladder 157.

Voltage between second band gap reference circuit 130 and resistor ladder 157 is denoted as LREF2_P. The magnitude of LREF2_P decreases through resistor 158, through resistor 160, and again through resistor 162. A p-well low voltage reference (P_REF_LV) tapped between resistor 158 and 160 on the resistor ladder 157 is coupled as input to p-well low voltage monitor 154. A second p-well voltage reference tapped between resistor 160 and resistor 162 on the resistor ladder 157 is coupled as an input to p-well high voltage monitor 156. Note that voltages P_REF_HV and P_REF_LV can be tapped at other suitable locations between different resistors on resistor ladder 157.

Self-test circuit 152 is coupled to n-well monitors 126, 128 and p-well monitors 154, 156 and is used to determine whether any of monitors 126, 128, 154, 156 function correctly. For example, self-test circuit 152 can check whether the low voltage monitors 128, 156 change state when their inputs switch to an internally generated voltage below their reference voltages. Also the self-test circuit 152 can check whether the high voltage monitors 126, 154 change state when their inputs switch to internal generated voltages above their references.

Figure 2:
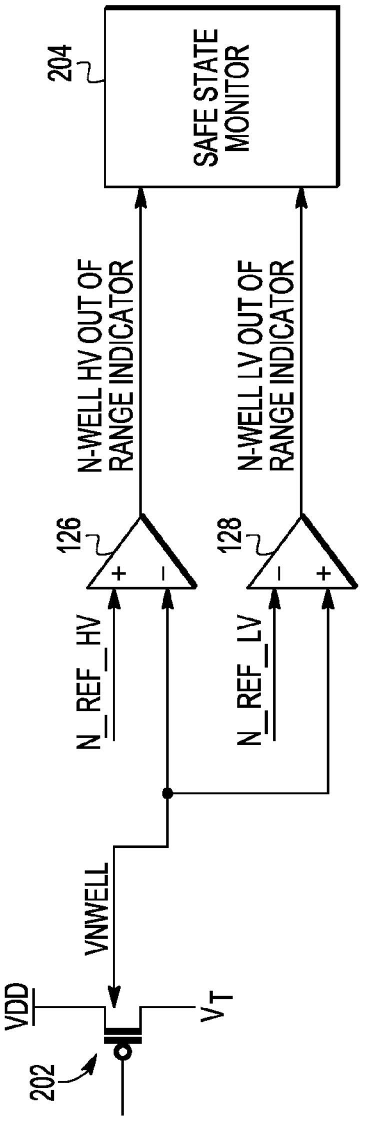
FIG. 2 is a block diagram of an embodiment of n-well high and low voltage monitors that can be used in the integrated circuit of FIG. 1.

FIG. 2 is a block diagram of an embodiment of n-well high voltage and low voltage monitors 126, 128 that can be used in the integrated circuit 100 of FIG. 1. P-type device 202 includes a back gate terminal coupled to n-well bias voltage (VNWELL) from n-well regulator 122 (FIG. 1). An n-well high voltage reference (N_REF_HV) is coupled to a positive input of comparator 126 and VNWELL is coupled to a negative input of comparator 126. The output of comparator 126 is an indicator of whether n-well back bias voltage is outside a specified range that is provided to safe state monitor circuit 204. For example, if the allowable range of n-well reverse back bias voltage for p-type device 202 is N_REF_HV, which is equal to VDDC plus 300 milliVolts, the n-well high voltage (or upper) out of range indicator can assert when the VNWELL is above N_REF_HV. Other suitable ranges for reverse back bias voltage values can be used with plus 300 mV being used as an example.

An n-well low voltage reference (N_REF_LV) is coupled to a negative input of comparator 128 and VNWELL is coupled to a positive input of comparator 128. The output of comparator 128 is an indicator of whether n-well bias voltage is outside a specified range. For example, if the allowable range of forward back bias voltage for p-type device 202 is VDDC minus 300 milliVolts, n-well low voltage (or lower) out of range indicator can assert when the VNWELL is below N_REF_LV. Other suitable ranges for forward back bias voltage values can be used with minus 300 mV being used as an example.

If the forward or reverse back bias voltage for p-type device 202 is outside the allowable range, safe state monitor circuit 204 can issue a request to a controller (not shown) for the integrated circuit 100 (FIG. 1) to place logic gates 124 in a safe mode, such as reset or other suitable mode.

Figure 3:
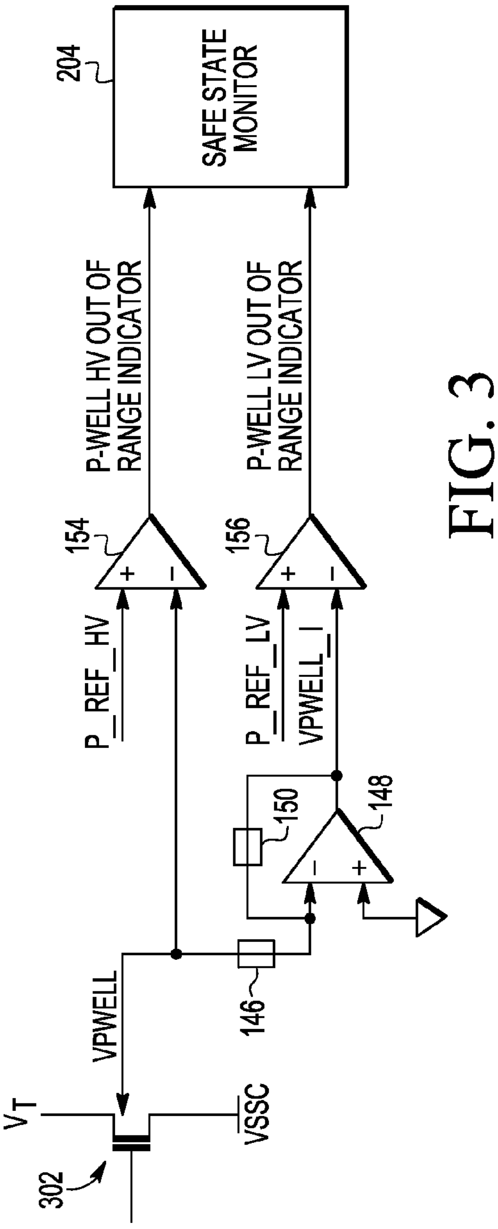
FIG. 3 is a block diagram of an embodiment of p-well high and low voltage monitors that can be used in the integrated circuit of FIG. 1.

FIG. 3 is a block diagram of an embodiment of p-well bias high and low voltage monitors 154, 156 that can be used in the integrated circuit 100 of FIG. 1. N-type device 302 includes a back gate terminal coupled to p-well bias voltage (VPWELL) from p-well regulator 140 (FIG. 1). A p-well high voltage reference (P_REF_HV) is coupled to a positive input of comparator 154 and VPWELL is coupled to a negative input of comparator 154. The output of comparator 154 is provided to safe state monitor circuit 204 as an indicator of whether p-well forward bias voltage is outside a specified range. For example, if the allowable range of forward back bias voltage for n-type device 302 is VSSC plus 300 milliVolts (P_REF_HV), p-well high voltage (or upper) out of range indicator can assert when the VPWELL goes above the P_REF_HV. Other suitable ranges for forward back bias voltage values can be used with plus 300 mV being used as an example.

A p-well low voltage reference (P_REF_LV) is coupled to a positive input of comparator 156. VPWELL is coupled to a terminal of resistor 146. A positive input of the amplifier 148 is coupled to ground. The output of the amplifier 148, denoted as VPWELL_I, is coupled to a negative input of comparator 156. Since VPWELL for reverse back biasing a p-well is a negative voltage, inverting gain-stage 144 inverts VPWELL to a positive voltage for comparison with p-well low voltage reference P_REF_LV by comparator 156. The output of comparator 156 is an indicator of whether p-well reverse bias voltage is outside a specified range that can be provided as another input to safe state monitor circuit 204. For example, if the allowable range of reverse back bias voltage for n-type device 302 is VSSC minus 300 milliVolts (mV), the reference P_REF_LV would equal to VSSC plus 350 mV and the p-well low voltage (or lower) out of range indicator can assert when the VPWELL_I is above P_REF_LV, which means that VPWELL is below VSSC minus 300 mV. Other suitable ranges for reverse back bias voltage values can be used with minus 300 mV being used as an example.

If the forward or reverse back bias voltage for n-type device 302 is outside the allowable range, safe state monitor circuit 204 can issue a request to a controller (not shown) for the integrated circuit 100 (FIG. 1) to place logic gates 124 in a safe mode, such as reset or other suitable mode.

By now it should be appreciated that an integrated circuit has been provided for generating and monitoring forward and reverse back bias voltages for circuit components such as MOS transistors. The circuit components may be used in logic or memory devices. High and low reference voltages of n-well and p-well monitors 126, 128, 154, 156 are generated using independent resistor ladders 131, 157 so that a failure of a corresponding n-well regulator 122 or p-well regulator 140 will be immediately detected. Similarly, if regulators 122, 140 are operating properly, but one or more monitors 126, 128, 154, 156 fail, the failure will be detected as well because it will appear to a controller for the integrated circuit that one or more of the bias voltages has drifted out of operating range.

In some embodiments, an integrated circuit can comprise a device (124, p-type OR n-type) of a first conductivity type formed in a first well; a voltage regulator (122 or 140) configured to provide a bias voltage (VNWELL or VPWELL) to the first well based on a first reference voltage (output of 120 or output of 110) which can be generated using a first band gap reference generator (102); and a monitor circuit (126/128 or 154/156) configured to compare a voltage of the first well to an upper limit and a lower limit of a first voltage range. Each of the upper limit and lower limit can be provided using a second band gap reference generator (130), separate from the first band gap reference generator. In response to determining that the voltage of the first well is outside of the first voltage range, a first out of range indicator can be provided.

In another aspect, the integrated circuit can further comprise a first resistive ladder (132-138 or 158-162) coupled to a band gap reference voltage (LREF2_N or LREF2_P) output by the second band gap reference generator and configured to provide each of the upper limit and lower limit to the monitor circuit.

In another aspect, the integrated circuit can further comprise a second resistive ladder (112-118 or 102, 103-104) coupled to a band gap reference voltage (LREF1_N or LREF1_P) output by the first band gap reference generator and configured to provide the first reference voltage.

In another aspect, the first out of range indicator can comprise a first upper out of range indicator; and a first lower out of range indicator.

In another aspect, the monitor circuit can be configured to assert the first upper out of range indicator when a voltage of the first well exceeds the upper limit and to assert the first lower out of range indicator when the voltage of the first well is below the lower limit.

In another aspect, the monitor circuit can be configured to assert the first out of range indicator when either the first upper range out of range indicator or the first lower out of range indicator can be asserted.

In another aspect, the monitor circuit can comprise a first comparator (126 or 154) which has a first input coupled to receive the upper limit, a second input coupled to the first well, and an output which provides the first upper out of range indicator; and a second comparator (128 or 156) which has a first input coupled to receive the lower limit, a second input coupled to the first well, and an output which provides the first lower out of range indicator.

In another aspect, the first conductivity type can be n-type, and the first well can be further characterized as a p-type well.

In another aspect, the integrated circuit can further comprise an inverting gain-stage circuit (144) coupled between the first well and the second input of the first comparator, wherein the inverting gain-stage circuit has an input coupled to the first well and an output coupled to the second input of the first comparator.

In another aspect, the integrated circuit can further comprise a second device of a second conductivity type, opposite the first conductivity type, formed in a second well, a second voltage regulator configured to provide a second bias voltage to the second well, based on a second reference voltage which can be generated using the first band gap reference generator, and a second monitor circuit configured to compare a voltage of the second well to an upper limit and a lower limit of a second voltage range. Each of the upper limit and lower limit of the second voltage range can be provided using the second band gap reference generator, wherein, in response to determining that the voltage of the second well is outside of the second voltage range, a second out of range indicator can be provided.

In another aspect, the integrated circuit can further comprise a first resistive ladder (132-138) coupled to a first band gap reference voltage (LREF2_N) output by the second band gap reference generator and configured to provide each of the upper limit and lower limit of the first address range to the monitor circuit, a second resistive ladder (158-162) coupled to a second band gap reference voltage (LREF2_P) output by the second band gap reference generator and configured to provide each of the upper limit and lower limit of the second address range to the second monitor circuit.

In another aspect, the integrated circuit can further comprise a third resistive ladder (112-118) coupled to a first band gap reference voltage (LREF1_N) output by the first band gap reference generator and configured to provide the first reference voltage, and a fourth resistive ladder (103-104) coupled to a second band gap reference voltage (LERF1_P) output by the first band gap reference generator and configured to provide the second reference voltage.

In another aspect, the integrated circuit can further comprise self test circuitry (152) configured to test the monitor circuits.

In another embodiment, a method can comprise generating a bias voltage (VNWELL or VPWELL) based on a first band gap reference voltage (LREF1_N or LREF1_P) that can be generated by a first band gap reference generator; providing the bias voltage to a first well of an integrated circuit (124), in which the first well comprises at least one device of a first conductivity type; generating an upper voltage limit reference and a lower voltage limit reference based on a second band gap reference voltage that can be generated by a second band gap reference generator; determining if a voltage of the first well is within a voltage range defined by the upper and lower voltage limit references; and in response to the determining, providing an out of range indicator.

In another aspect, the determining if the voltage of the first well is within the voltage range can further comprise comparing the voltage at the first well with the upper voltage limit reference; and comparing the voltage at the first well with the lower voltage limit reference.

In another aspect, providing the out of range indicator can comprise asserting the out of range indicator if either the voltage at the first well exceeds the upper voltage limit reference or the voltage at the first well is less than the lower voltage limit reference.

In still further embodiments, an integrated circuit can comprise an n-type device (124) formed in a p-type well; a p-type device (124) formed in an n-type well; a first voltage regulator (140) configured to provide a first bias voltage (VPWELL) to the p-type well based on a first reference voltage (output of 110) which can be generated using a first band gap reference generator (102); a second voltage regulator (122) configured to provide a second bias voltage (VNWELL) to the n-type well based on a second reference voltage (output of 120) which can be generated using the first band gap reference generator; and a monitor circuit (126, 128, 154, and 156) configured to compare a voltage of the p-type well to a first voltage range. The limits of the first voltage range can be provided using a second band gap reference generator (130), separate from the first band gap reference generator, wherein, in response to determining that the voltage of the p-type well is outside of the first voltage range, a first out of range indicator can be provided. A voltage of the n-type well can be compared to a second voltage range. Limits of the second voltage range can be provided using the second band gap reference generator, wherein, in response to determining that the voltage of the n-type well is outside of the second voltage range, a second out of range indicator can be provided.

In another aspect, the circuit can further comprise a first resistive ladder (158-162) coupled to a first band gap reference voltage (LREF2_P) output by the second band gap reference generator and configured to provide the limits of the first address range to the monitor circuit, and a second resistive ladder (132-138) coupled to a second band gap reference voltage (LREF2_N) output by the second band gap reference generator and configured to provide the limits of the second address range to the monitor circuit.

In another aspect, the circuit can further comprise a third resistive ladder (102, 103-104) coupled to a first band gap reference voltage (LREF1_P) output by the first band gap reference generator and configured to provide the first reference voltage; and a fourth resistive ladder coupled to a second band gap reference voltage output (LREF1_N) by the first band gap reference generator and configured to provide the second reference voltage.

In another aspect, the circuit can further comprise self test circuitry (152) configured to test the monitor circuit.

Although the disclosure has been described with respect to specific conductivity types or polarity of potentials, skilled artisans appreciated that conductivity types and polarities of potentials may be reversed.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, a top oxide and a bottom oxide were described but another insulating material may be substituted. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:

a device of a first conductivity type formed in a first well;

a voltage regulator configured to provide a bias voltage to the first well based on a first reference voltage which is generated using a first band gap reference generator;

a monitor circuit configured to compare a voltage of the first well to an upper limit and a lower limit of a first voltage range, wherein each of the upper limit and lower limit is provided using a second band gap reference generator, separate from the first band gap reference generator, wherein, in response to determining that the voltage of the first well is outside of the first voltage range, providing a first out of range indicator.

2. The integrated circuit of claim 1, further comprising:

a first resistive ladder coupled to a band gap reference voltage output by the second band gap reference generator and configured to provide each of the upper limit and lower limit to the monitor circuit.

3. The integrated circuit of claim 2, further comprising:

a second resistive ladder coupled to a band gap reference voltage output by the first band gap reference generator and configured to provide the first reference voltage.

4. The integrated circuit of claim 1, wherein the first out of range indicator comprises:

a first upper out of range indicator; and a first lower out of range indicator.

5. The integrated circuit of claim 4, wherein the monitor circuit is configured to assert the first upper out of range indicator when a voltage of the first well exceeds the upper limit and to assert the first lower out of range indicator when the voltage of the first well is below the lower limit.

6. The integrated circuit of claim 5, wherein the monitor circuit is configured to assert the first out of range indicator when either the first upper out of range indicator or the first lower out of range indicator is asserted.

7. The integrated circuit of claim 4, wherein the monitor circuit comprises:

a first comparator which has a first input coupled to receive the upper limit, a second input coupled to the first well, and an output which provides the first upper out of range indicator; and a second comparator which has a first input coupled to receive the lower limit, a second input coupled to the first well, and an output which provides the first lower out of range indicator.

8. The integrated circuit of claim 7, wherein the first conductivity type is n-type, and the first well is further characterized as a p-type well.

9. The integrated circuit of claim 8, further comprising:

an inverting gain-stage circuit coupled between the first well and the second input of the first comparator, wherein the inverting gain-stage circuit has an input coupled to the first well and an output coupled to the second input of the first comparator.

10. The integrated circuit of claim 1, further comprising:

a second device of a second conductivity type, opposite the first conductivity type, formed in a second well;

a second voltage regulator configured to provide a second bias voltage to the second well, based on a second reference voltage which is generated using the first band gap reference generator; and a second monitor circuit configured to compare a voltage of the second well to an upper limit and a lower limit of a second voltage range, wherein each of the upper limit and lower limit of the second voltage range is provided using the second band gap reference generator, wherein, in response to determining that the voltage of the second well is outside of the second voltage range, providing a second out of range indicator.

11. The integrated circuit of claim 10, further comprising:

a first resistive ladder coupled to a first band gap reference voltage output by the second band gap reference generator and configured to provide each of the upper limit and lower limit of the first voltage range to the monitor circuit;

a second resistive ladder coupled to a second band gap reference voltage output by the second band gap reference generator and configured to provide each of the upper limit and lower limit of the second voltage range to the second monitor circuit.

12. The integrated circuit of claim 11, further comprising:

a third resistive ladder coupled to a first band gap reference voltage output by the first band gap reference generator and configured to provide the first reference voltage; and a fourth resistive ladder coupled to a second band gap reference voltage output by the first band gap reference generator and configured to provide the second reference voltage.

13. The integrated circuit of claim 1, further comprising:

self test circuitry configured to test the monitor circuits.

14. A method comprising:

generating a bias voltage based on a first band gap reference voltage that is generated by a first band gap reference generator;

providing the bias voltage to a first well of an integrated circuit, in which the first well comprises at least one device of a first conductivity type;

generating an upper voltage limit reference and a lower voltage limit reference based on a second band gap reference voltage that is generated by a second band gap reference generator;

determining if a voltage of the first well is within a voltage range defined by the upper and lower voltage limit references; and in response to the determining, providing an out of range indicator.

15. The method of claim 14, wherein the determining if the voltage of the first well is within the voltage range further comprises:

comparing the voltage at the first well with the upper voltage limit reference; and comparing the voltage at the first well with the lower voltage limit reference.

16. The method of claim 15, wherein providing the out of range indicator comprises:

asserting the out of range indicator if either the voltage at the first well exceeds the upper voltage limit reference or the voltage at the first well is less than the lower voltage limit reference.

17. An integrated circuit, comprising:

an n-type device formed in a p-type well;

a p-type device formed in an n-type well;

a first voltage regulator configured to provide a first bias voltage to the p-type well based on a first reference voltage which is generated using a first band gap reference generator;

a second voltage regulator configured to provide a second bias voltage to the n-type well based on a second reference voltage which is generated using the first bad gap reference generator;

a monitor circuit configured to:

compare a voltage of the p-type well to a first voltage range, wherein limits of the first voltage range are provided using a second band gap reference generator, separate from the first band gap reference generator, wherein, in response to determining that the voltage of the p-type well is outside of the first voltage range, providing a first out of range indicator; and compare a voltage of the n-type well to a second voltage range, wherein limits of the second voltage range are provided using the second band gap reference generator, wherein, in response to determining that the voltage of the n-type well is outside of the second voltage range, providing a second out of range indicator.

18. The integrated circuit of claim 17, further comprising:

a first resistive ladder coupled to a first band gap reference voltage output by the second band gap reference generator and configured to provide the limits of the first voltage range to the monitor circuit;

a second resistive ladder coupled to a second band gap reference voltage output by the second band gap reference generator and configured to provide the limits of the second voltage range to the monitor circuit.

19. The integrated circuit of claim 18, further comprising:

a third resistive ladder coupled to a first band gap reference voltage output by the first band gap reference generator and configured to provide the first reference voltage; and a fourth resistive ladder coupled to a second band gap reference voltage output by the first band gap reference generator and configured to provide the second reference voltage.

20. The integrated circuit of claim 17, further comprising: self test circuitry configured to test the monitor circuit.

* * * * *